(12) United States Patent
Baek

(10) Patent No.: US 7,920,007 B2
(45) Date of Patent: Apr. 5, 2011

(54) APPARATUS FOR OUTPUTTING DATA OF SEMICONDUCTOR INTEGRATED CIRCUIT

(75) Inventor: Chang Ki Baek, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 70 days.

(21) Appl. No.: 12/494,423

(22) Filed: Jun. 30, 2009

(65) Prior Publication Data

US 2010/0231274 A1    Sep. 16, 2010

(30) Foreign Application Priority Data

Mar. 12, 2009 (KR) .................. 10-2009-0021163

(51) Int. Cl.
*H03K 3/00* (2006.01)
(52) U.S. Cl. .... 327/291; 327/295; 327/231; 365/233.11
(58) Field of Classification Search .................. 327/231, 327/233, 291, 293, 295, 296; 365/233.1, 365/233.11, 233.12
See application file for complete search history.

(56) References Cited

U.S. PATENT DOCUMENTS

| | | | |
|---|---|---|---|
| 5,487,092 A * | 1/1996 | Finney et al. | ................. 375/354 |
| 6,026,051 A | 2/2000 | Keeth et al. | |
| 6,160,731 A | 12/2000 | Choi | |
| 6,181,638 B1 * | 1/2001 | Jeddeloh | .................... 365/233.1 |
| 6,349,399 B1 | 2/2002 | Manning | |
| 6,636,110 B1 | 10/2003 | Ooishi et al. | |
| 6,643,789 B2 | 11/2003 | Mullarkey | |

FOREIGN PATENT DOCUMENTS

| JP | 11-316617 A | 11/1999 |
|---|---|---|
| KR | 1020030087743 A | 11/2003 |

* cited by examiner

*Primary Examiner* — An T Luu
(74) *Attorney, Agent, or Firm* — Ladas & Parry LLP

(57) ABSTRACT

A data outputting apparatus of a semiconductor integrated circuit if presented for use in standardizing output timing brought about by different electrical output path lengths. The apparatus includes a data clock signal generating section and a data output section. The data clock signal generating section is configured to use an external clock signal in order to generate a plurality of data clock signals in which output timings of the data clock signals vary depending on a data output mode. The data output section is configured to be controlled by the plurality of data clock signals to output inputted data to the outside through a plurality of data input/output pads that have different path lengths.

18 Claims, 5 Drawing Sheets

APPARATUS FOR OUTPUTTING DATA OF SEMICONDUCTOR INTEGRATED CIRCUIT

CROSS-REFERENCES TO RELATED PATENT APPLICATION

The present application claims priority under 35 U.S.C 119(a) to Korean Application No. 10-2009-0021163, filed on Mar. 12, 2009, in the Korean Intellectual Property Office, which is incorporated herein by reference in its entirety as set forth in full.

BACKGROUND

1. Technical Field

The present invention described herein relates to a semiconductor integrated circuit (IC) and, more particularly, to an apparatus for outputting data of a semiconductor IC.

2. Related Art

In semiconductor integrated circuits, data are inputted and outputted by a plurality of data input/output pads.

At this time, data clock signals are used to synchronize data output by the plurality of data input/output pads.

Since the plurality of input/output pads are separated from one another at different distances with respect to the circuit layout, the data clock signals should be supplied to the plurality of input/output pads in some sort of manner as to accommodate these different distances.

Referring to an output data waveform of semiconductor integrated circuit according to a prior art shown in FIG. 1, distributed data clock signals 'CLK0' to 'CLK3' are used and phases of the data clock signals 'CLK1' and 'CLK2' are deviated from those of the data clock signals 'CLK0' and 'CLK3' in a data output mode (X32 MODE) in which 32-bit data are outputted through all 32 data input/output pads. In this case, output data 'DATA OUT_X32' also has output timings deviated from each other.

Therefore, development of a technology that can reduce a timing error between the plurality of data clock signals has been required in order to improve the reliability of the output data in the semiconductor integrated circuit.

SUMMARY

An apparatus for outputting data of a semiconductor integrated circuit so as to prevent or at least protect against timing errors between a plurality of data clock signals from being generated is disclosed herein.

In one embodiment, a data outputting apparatus of a semiconductor integrated circuit includes a data clock signal generating section configured to generate a plurality of data clock signals of which output timings vary in accordance to a data output mode using an external clock signal; and an data output section configured to output inputted data to the outside through a plurality of data input/output pads in accordance to the plurality of data clock signals.

In another embodiment, a data outputting apparatus of a semiconductor integrated circuit includes a data output section configured to output inputted data to the outside through a plurality of data input/output pads in accordance to a plurality of data clock signals; a clock tree circuit configured to generate the plurality of data clock signals by distributing external clock signal to a plurality of different paths; and an output timing controller configured to control an output timing of a data clock signal transmitted through at least one of the plurality of paths of the clock tree circuit in response to a data output mode signal for defining the output of data through all or some of the plurality of data input/output pads.

In yet another embodiment, a data outputting apparatus of a semiconductor integrated circuit includes a data output section configured to output inputted data to the outside through a plurality of data input/output pads in accordance to a plurality of data clock signals; a clock tree circuit configured to generate the plurality of data clock signals by distributing external clock signal to a plurality of different paths; and an output timing controller configured to control an output timing of a data clock signal transmitted through at least one relatively shorter path among a plurality of paths of the clock tree circuit in response to a data output mode signal.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
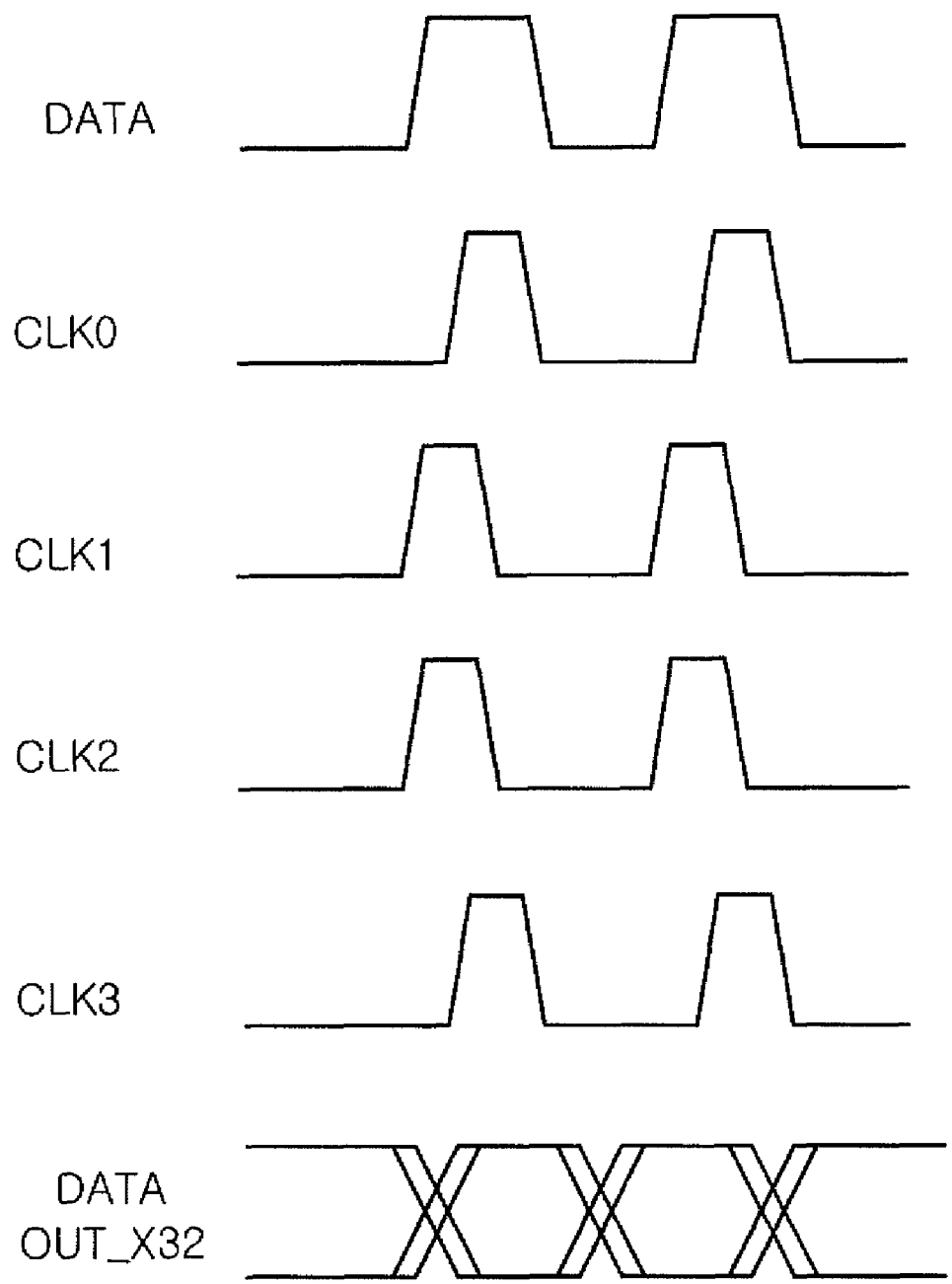
FIG. 1 is a waveform diagram illustrating generation of a timing error of output data of a semiconductor integrated circuit according to a prior art.
Figure 2:
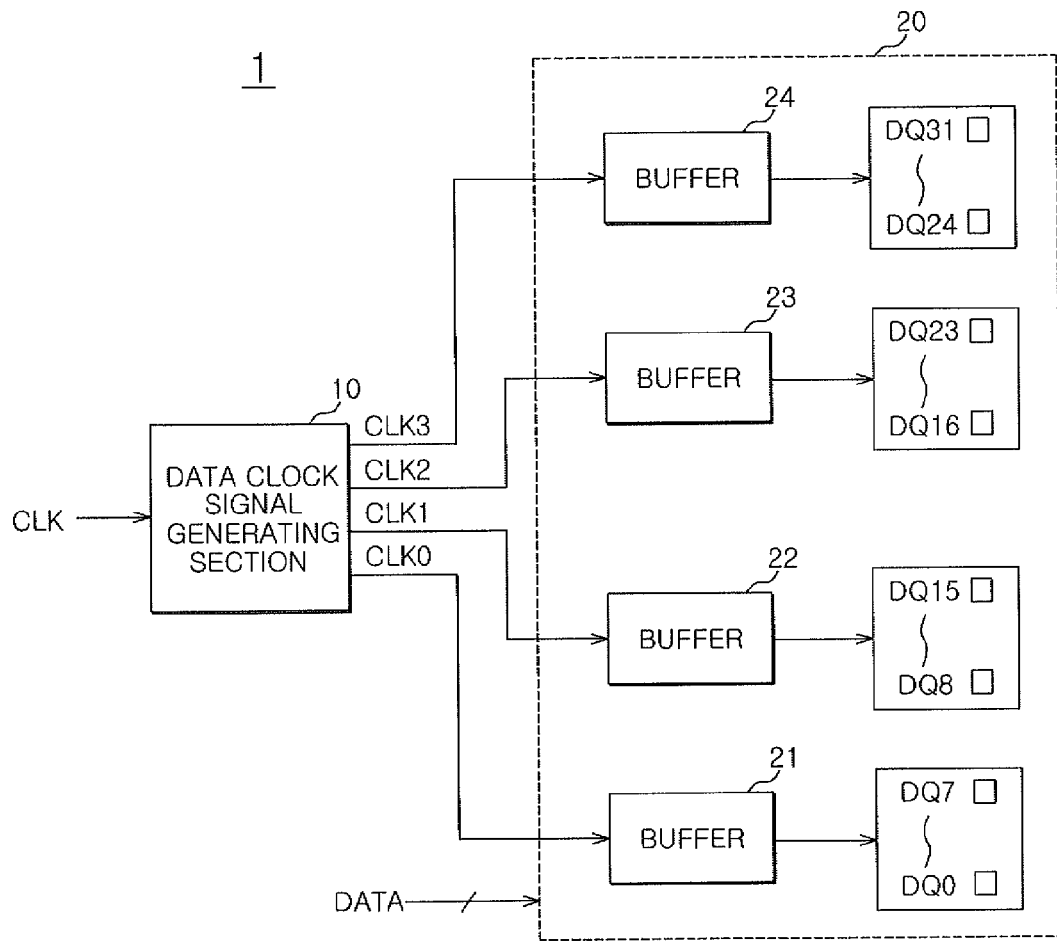
FIG. 2 is a block diagram of an exemplary data outputting apparatus of a semiconductor integrated circuit according to one embodiment.

FIG. 2 is a block diagram of an exemplary data outputting apparatus of a semiconductor integrated circuit according to one embodiment.

As shown in FIG. 2, the data outputting apparatus 1 of the semiconductor memory apparatus can include a data clock signal generating section 10 and a data output section 20.

The data clock signal generating section 10 can generate a plurality of data clock signals 'CLK0' to 'CLK3' by receiving an external clock signal 'CLK'.

The data output section 20 can include a plurality of buffers 21 to 24 and a plurality of data input/output pads DQ0 to DQ31. At this time, the plurality of data input/output pads DQ0 to DQ31 is based on a semiconductor integrated circuit that can output data of maximum 32 bits.

Since positions of the plurality of data input/output pads DQ0 to DQ31 are different from each other, lengths of signal lines for transmitting the plurality of data clock signals 'CLK0' to 'CLK3' to the plurality of data input/output pads DQ0 to DQ31 are also different from each other. Therefore, the plurality of data input/output pads DQ0 to DQ31 are grouped as DQ0 to DQ7, DQ8 to DQ15, DQ16 to DQ23, and DQ24 to DQ31 so that the plurality of data clock signals 'CLK0' to 'CLK3' can be supplied to the plurality of data input/output pads 'DQ0' to 'DQ31' at a predetermined level and the plurality of buffers 21 to 24 are allocated to each group.

Further, although not shown, the data output section 20 includes circuit components for processing data 'DATA'. The data 'DATA' inputted through the circuit components are outputted to the outside of the semiconductor integrated circuit through the plurality of data input/output pads 'DQ0' to 'DQ31'.

Figure 3:
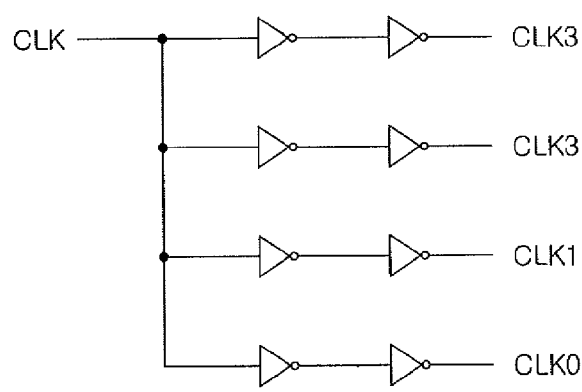
FIG. 3 is a circuit diagram of an exemplary data clock signal generating section 10 that can be included with the circuit of FIG. 2 according to one embodiment.

FIG. 3 is a circuit diagram of an exemplary data clock signal generating section 10 that can be included with the circuit of FIG. 2 according to one embodiment.

As shown in FIG. 3, the data clock signal generating section 10 can generate the plurality of data clock signals 'CLK0' to 'CLK3' by distributing the external clock signal 'CLK' through different paths using a clock tree structure that is preferably composed of inverters.

Figure 4:
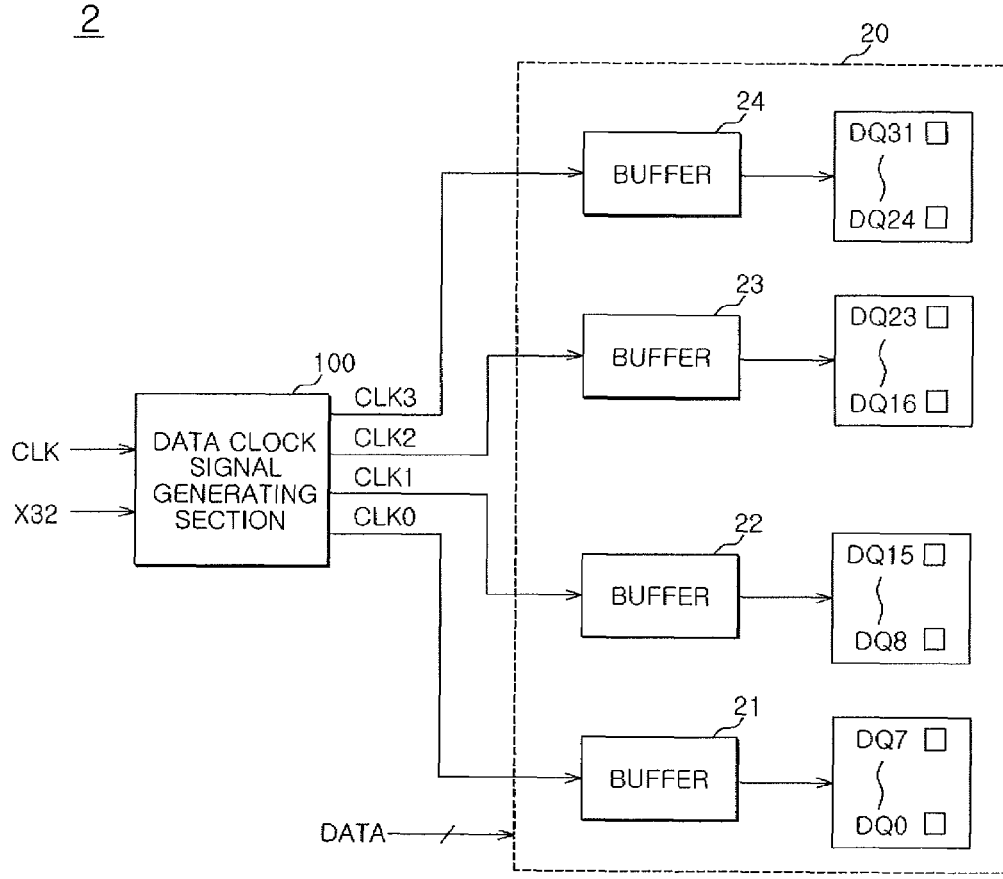
FIG. 4 is a block diagram of an exemplary data outputting apparatus of a semiconductor integrated circuit according to another embodiment.

FIG. 4 is a block diagram of an exemplary data outputting apparatus of a semiconductor integrated circuit according to another embodiment.

As shown in FIG. 4, the data outputting apparatus 2 of the semiconductor memory apparatus can include a data clock signal generating section 100 and a data output section 20.

The data clock signal generating section 100 is configured to generate a plurality of data clock signals 'CLK0' to 'CLK3' by receiving an external clock signal 'CLK' and a data output mode signal 'X32'.

At this time, the data output mode signal 'X32' corresponds to a signal that is used to distinguish a first data output mode 'X16 MODE' and a second data output mode 'X32 MODE' from each other. In the first data output mode 'X16 MODE' and the second data output mode 'X32 MODE' the semiconductor integrated circuit outputs 16-bit data and 32-bit depending on the one-time read command, respectively.

The data output section 20 can include a plurality of buffers 21 to 24 and a plurality of data input/output pads DQ0 to DQ31. Even though in this exemplary embodiment, the plurality of data input/output pads DQ0 to DQ31 is based on a semiconductor integrated circuit that can output data of maximum 32 bits, it is envisioned that the plurality of data input/output pads and the output data need not be restricted to a maximum of 32 bits.

Since positions of the plurality of data input/output pads DQ0 to DQ31 are different from each other, lengths of signal lines for transmitting the plurality of data clock signals 'CLK0' to 'CLK3' to the plurality of data input/output pads 'DQ0' to 'DQ31' are also different from each other. Therefore, the plurality of data input/output pads DQ0 to DQ31 are grouped as DQ0 to DQ7, DQ8 to DQ15, DQ16 to DQ23, and DQ24 to DQ31 so that the plurality of data clock signals 'CLK0' to 'CLK3' can be supplied to the plurality of data input/output pads 'DQ0' to 'DQ31' at a corresponding predetermined level and the plurality of buffers 21 to 24 are allocated to each group.

Further, although not shown, the data output section 20 includes circuit components for processing data 'DATA'. The data 'DATA' inputted through the circuit components are outputted outside of the semiconductor integrated circuit through the plurality of data input/output pads 'DQ0' to 'DQ31'.

Figure 5:
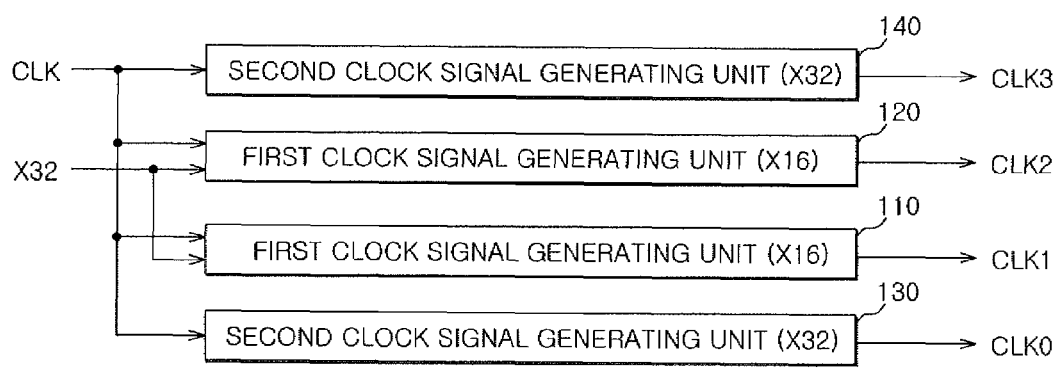
FIG. 5 is a block diagram of another exemplary data clock signal generating section 100 that can be included with the circuit of FIG. 4 according to another embodiment.

FIG. 5 is a block diagram of another exemplary data clock signal generating section 100 that can be included with the circuit of FIG. 4 according to another embodiment.

As shown in FIG. 5, the data clock signal generating section 100 can include first clock signal generating units (X16) 110 and 120 and second clock signal generating units (X32) 130 and 140.

The first clock signal generating units (X16) 110 and 120 can generate the plurality of data clock signals 'CLK1' and 'CLK2' by receiving the external clock signal 'CLK' and the data output mode signal 'X32'.

The second clock signal generating units (X32) 130 and 140 can generate the plurality of data clock signals 'CLK0' and 'CLK3' by receiving the external clock signal 'CLK'.

Figure 6:
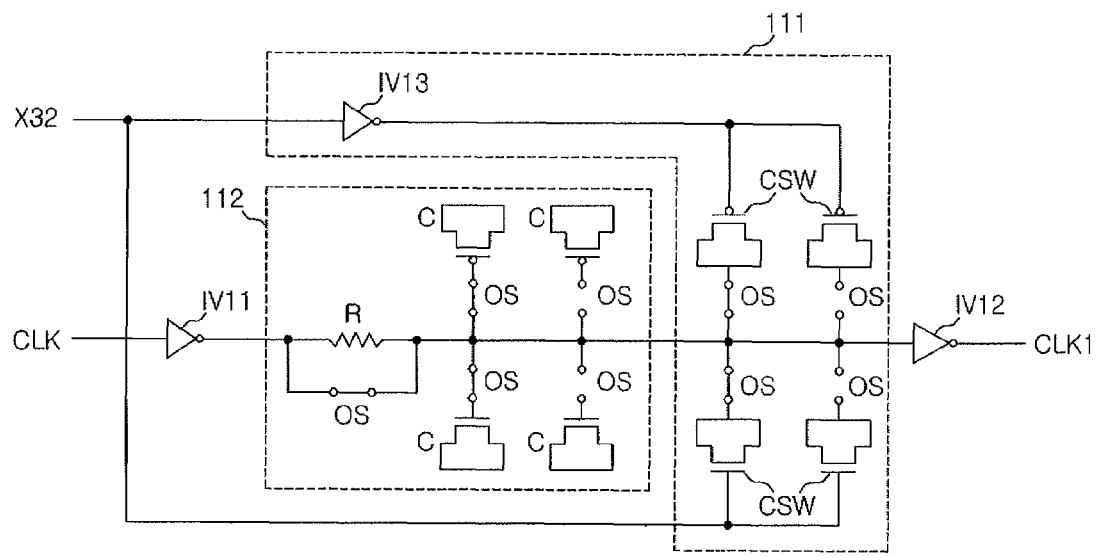
FIG. 6 is a circuit diagram of an exemplary first clock signal generating unit (X16) 110 that can be included with the generator of FIG. 5 according to another embodiment.

FIG. 6 is a circuit diagram of an exemplary first clock signal generating unit (X16) 110 that can be included with the generator of FIG. 5 according to another embodiment.

As shown in FIG. 6, the first clock signal generating unit (X16) 110 can include first and second inverters IV11 and IV12, an output timing controller 111, and a delay option 112.

The first and second inverters IV11 and IV12 constitute a buffer structure. The first and second inverters IV11 and IV12 can generate the first data clock signal 'CLK1' by buffering the external clock signal 'CLK'.

The output timing controller 111 can include a third inverter IV13, a plurality of control-type capacitors CSW, and a plurality of option switches OS.

The third inverter IV13 can receive the data output mode signal 'X32'. The plurality of control-type capacitors CSW are, in parallel, connected to a signal line between the first inverter IV11 and the second inverter IV12 through the plurality of option switches OS. The plurality of control-type capacitors CSW operate depending on the output of the third inverter IV13 or the data output mode signal 'X32'.

The delay option 112 is a circuit component for use in basic delay time setting or delay time trimming. The delay option 112 may be selectively provided depending on the design of the circuit. The delay option 112 can include a resistor R, a plurality of capacitors C, and a plurality of option switches OS. The delay option 112 is configured to control a delay time by using the plurality of option switches OS.

The first clock signal generating unit (X16) 120 can be implemented similarly as the first clock signal generating unit (X16) 110.

When the data output mode signal 'X32' is at a level indicating the first data output mode 'X16 MODE' i.e., a low level, all the plurality of control-type capacitors CSW cannot operates as a delay element. Therefore, the external clock signal 'CLK' is outputted as the first data clock signals 'CLK1' and 'CLK2' via the first and second inverters IV11 and IV12. Of course, when the delay option 112 is provided and a predetermined delay time is set, a delay time corresponding to the delay option 112 is applied to the first data lock signals 'CLK1' and 'CLK2'.

Meanwhile, when the data output mode signal 'X32' is at a level indicating the second data output mode 'X32 MODE', i.e., a high level, the control-type capacitor CSW connected to the signal line between the first inverter IV11 and the second inverter IV12 by establishing the option switch OS among the plurality of control-type capacitors CSW, which operates as the delay element, delays an output signal of the first inverter IV11 by the corresponding delay time and outputs the delayed output signal to the second inverter IV12. Accordingly, it is possible to vary the delay time by adjusting the number of the control-type capacitors CSW that are connected to the signal line between the first inverter IV11 and the second inverter IV12 using the plurality of option switches OS. Of course, when the delay option 112 is provided and a predetermined delay time is set, a delay time corresponding to the delay option 112 is applied to the first data clock signals 'CLK1' and 'CLK2'.

Therefore, output timings of the first data clock signals 'CLK1' and 'CLK2' are delayed by a delay time set in each of the output timing controller 111 or/and the delay option 112.

Figure 7:
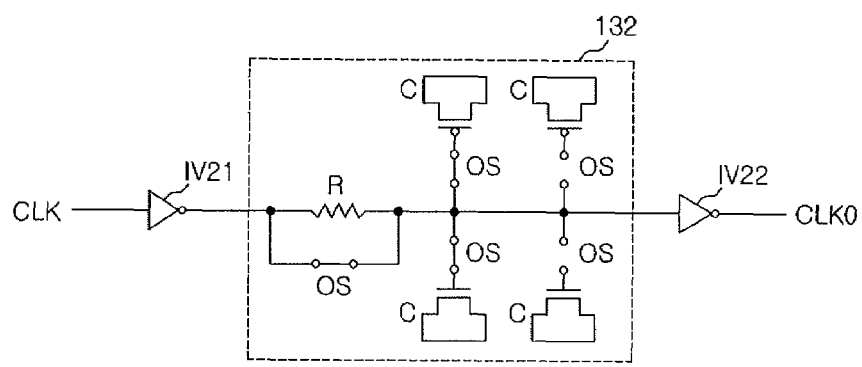
FIG. 7 is a circuit diagram of an exemplary second clock signal generating unit (X32) 130 that can be included with the generator of FIG. 5 according to another embodiment.

FIG. 7 is a circuit diagram of an exemplary second clock signal generating unit (X32) 130 that can be included with the generator of FIG. 5 according to another embodiment.

As shown in FIG. 7, the second clock signal generating unit (X32) 130 can include first and second inverters IV21 and IV22 and a delay option 132.

The first and second inverters IV21 and IV22 and the delay option 132 can be implemented similarly as the first and second inverters IV11 and IV12 and the delay option 112 of the first clock signal generating unit (X16) 110.

The second clock signal generating unit (X32) 140 can be implemented similarly as the second clock signal generating unit (X32) 130.

The first clock signal generating units (X32) 130 and 140 operate similarly as the first clock signal generating unit (X16) 110 when the data output mode signal 'X32' is at the level indicating the first data output mode 'X16 MODE'. However, when the data output mode signal 'X32' is at the level indicating the first data output mode 'X16 MODE', the data are not outputted through the data input/output pad groups 'DQ0 to DQ7 and DQ24 to DQ31 that are connected to the second clock signal generating units (X32) 130 and 140.

As described above, in the second data output mode 'X32 MODE', the data are outputted through all the data input/output pads DQ0 to DQ31.

Therefore, the output timing controller 111 of the first clock signal generating units (X16) 110 and 120 is configured to delay the output timings of the first data clock signals 'CLK1' and 'CLK2' for a predetermined time by recognizing the second data output mode 'X32 MODE' depending on the data output mode signal 'X32' to input the first data clock signals 'CLK1' and 'CLK2' and the second data clock signals 'CLK0' and 'CLK3' into the plurality of buffers 21 to 24 at the same time.

The data output section 20 can also output the data at the same time through the data input/output pads DQ0 to DQ31 in response to the first data clock signals 'CLK1' and 'CLK2' and the second data clock signals 'CLK0' and 'CLK3' that are inputted at the same time.

Meanwhile, in the first data output mode 'X16 MODE' the data are not outputted through the data input/output pad groups DQ0 to DQ7 and DQ24 to DQ31 that are connected to the second clock signal generating units (X32) 130 and 140.

Therefore, the first clock signal generating units (X16) 110 and 120 can output the first data clock signals 'CLK1' and 'CLK2' to the plurality of buffers 22 and 23 without any additional delay time by the output timing controller 111 by recognizing the first data output mode 'X16 MODE' depending on the data output mode signal 'X32'.

In addition, the data output section 20 can output the data through the data input/output pads DQ8 to DQ23 depending on the first data clock signals 'CLK1' and 'CLK2'.

Figure 8:
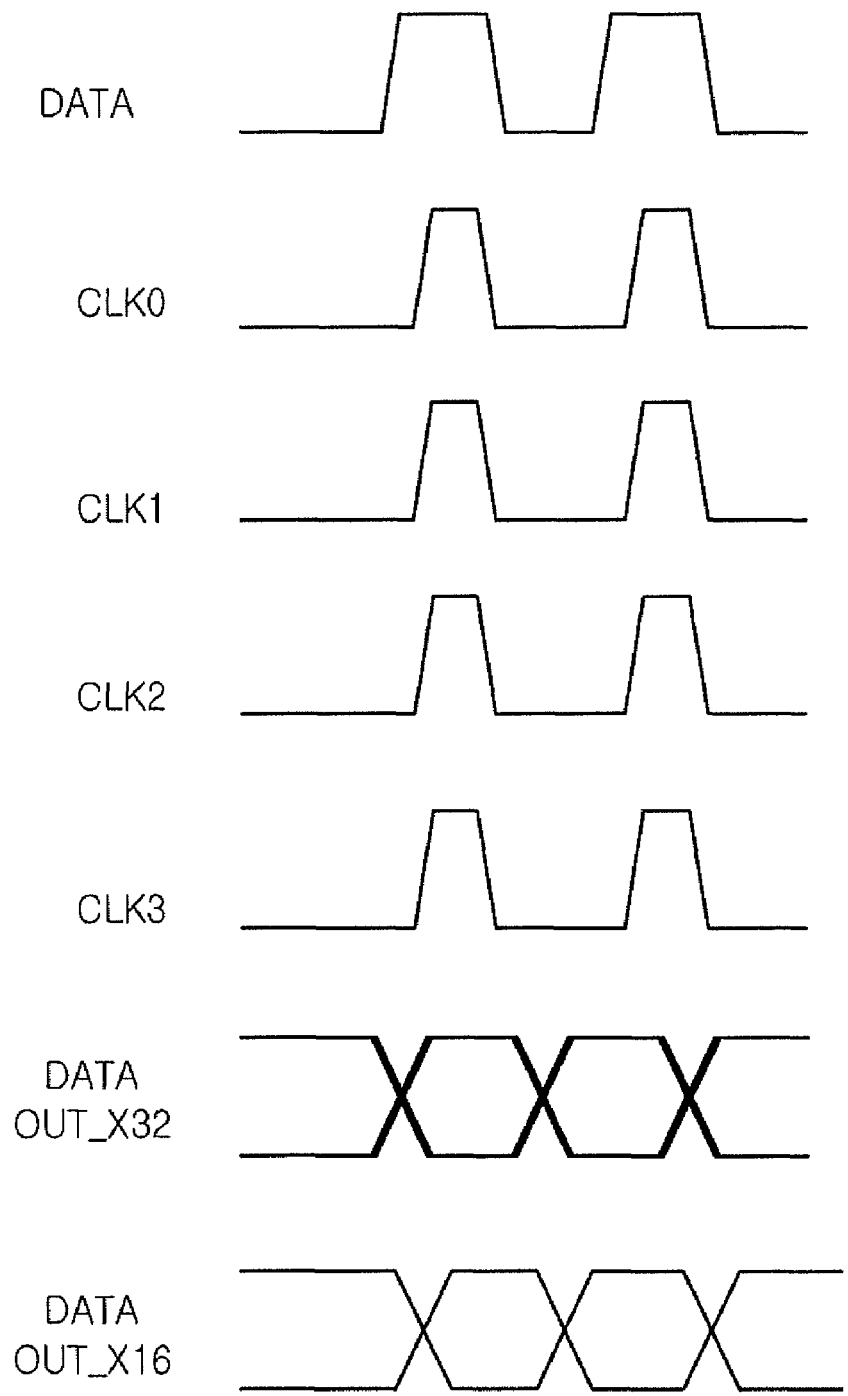
FIG. 8 is a waveform diagram of output data according to one embodiment.

FIG. 8 depicts a waveform diagram of output data according to one embodiment.

In the case of a waveform of output data 'DATA OUT_32' shown in FIG. 8, phases of the first data clock signals 'CLK1' and 'CLK2' coincide with those of the second data clock signals 'CLK0' and 'CLK3' in the data output mode 'X32 MODE'.

In the above-mentioned other embodiments, the data clock signal generating section 100 is divided into the first clock signal generating units (X16) 110 and 120 and the second clock signal generating units (X32) 130 and 140. However, referring to an entire structure in the other embodiments, a clock tree is formed by connecting the first and second inverters IV11 and IV12 between a plurality of signal paths so as to distribute the external clock signal 'CLK' to the plurality of data clock signals 'CLK0' to 'CLK3'. In addition, in the second data output mode 'X32 MODE', all the data clock signals 'CLK0' to 'CLK3' can be inputted into the plurality of buffers 21 to 24 at the same time by delaying the output timings of the first data clock signals 'CLK1' and 'CLK2' through the first clock signal generating units (X16) 110 and 120 that are connected to a signal line for transmitting the first data clock signals 'CLK1' and 'CLK2' shorter than a signal line for transmitting the second data clock signals 'CLK0' and 'CLK3' among the plurality of signal paths.

While certain embodiments have been described above, it will be understood to those skilled in the art that the embodiments described are by way of example only. Accordingly, the apparatus described herein should not be limited based on the described embodiments. Rather, the apparatus described herein should only be limited in light of the claims that follow when taken in conjunction with the above description and accompanying drawings.

What is claimed is:

1. A data outputting apparatus of a semiconductor integrated circuit, comprising:
   a data clock signal generating section, using an external clock signal, configured to generate a plurality of data clock signals of which output timings of the data clock signals are varied depending on a data output mode; and
   an data output section configured to output inputted data to outside of the semiconductor integrated circuit through a plurality of data input/output pads depending on the plurality of data clock signals.

2. The data outputting apparatus of claim 1, wherein the data clock signal generating section includes:
   a first clock signal generating unit configured to generate a first data clock signal by buffering the external clock signal and configured to vary an output timing of the first data clock signal depending on a data output mode signal; and
   a second clock signal generating unit configured to generate a second data clock signal by buffering the external clock signal.

3. The data outputting apparatus of claim 2, wherein the first data clock signal is supplied to a data input/output pad used for a first data output mode among the plurality of data input/output pads.

4. The data outputting apparatus of claim 2, wherein the second data clock signal is supplied to a data input/output pad used for a second data output mode among the plurality of data input/output pads.

5. The data outputting apparatus of claim 2, wherein the first clock signal generating unit includes;
   a buffer configured to buffer and to output the external clock signal as the first data clock signal; and
   an output timing controller configured to vary a delay time of a signal that passes through the buffer depending on the data output mode signal.

6. The data outputting apparatus of claim 5, further comprising:
   a delay option configured to include a plurality of resistors and to selectively connect the plurality of resistors between an input terminal of the external clock signal and an output terminal of the first data clock signal.

7. The data outputting apparatus of claim 6, wherein the buffer includes a first inverter and a second inverter that are connected in series between the input terminal of the external clock signal and the output terminal of the first data clock signal.

8. The data outputting apparatus of claim 6, wherein the output timing controller includes at least one variable resistor that is connected in parallel between the input terminal of the external clock signal and the output terminal of the first data clock signal and the variable resistor having a resistance value dependent upon the data output mode signal.

9. A data outputting apparatus of a semiconductor integrated circuit, comprising:
- a data output section configured to output inputted data to outside of the semiconductor integrated circuit through a plurality of data input/output pads in response to a plurality of data clock signals;
- a clock tree circuit configured to generate the plurality of data clock signals by distributing an external clock signal through a plurality of different paths; and
- an output timing controller configured to control an output timing of a data clock signal transmitted through at least one of the plurality of paths of the clock tree circuit in response to a data output mode signal, the output timing controller for defining the output of data through all or some of the plurality of data input/output pads.

10. The data outputting apparatus of claim 9, wherein at least one path is connected to data input/output pads commonly used regardless of a data output mode.

11. The data outputting apparatus of claim 9, further comprising:
- a delay option configured to include a plurality of resistors and configured to selectively connect the plurality of resistors to the plurality of paths of the clock tree circuit, respectively.

12. The data outputting apparatus of claim 9, wherein the clock tree circuit includes a first inverter and a second inverter that are connected in series between each of the plurality of paths.

13. The data outputting apparatus of claim 9, wherein the output timing controller includes at least one variable resistor that is connected in parallel to at least one of the plurality of paths of the clock tree circuit and the variable resistor having a resistance value dependent on the data output mode signal.

14. A data outputting apparatus of a semiconductor integrated circuit, comprising:
- a data output section configured to output inputted data to outside of the semiconductor integrated circuit through a plurality of data input/output pads depending on a plurality of data clock signals;
- a clock tree circuit configured to generate the plurality of data clock signals by distributing an external clock signal to a plurality of different paths; and
- an output timing controller configured to control an output timing of a data clock signal transmitted through at least one relatively shorter path among the plurality of different paths of the clock tree circuit in response to a data output mode signal.

15. The data outputting apparatus of claim 14, wherein at least one path is connected to data input/output pads commonly used regardless of a data output mode.

16. The data outputting apparatus of claim 14, further comprising:
- a delay option configured to include a plurality of resistors and configured to selectively connect the plurality of resistors to the plurality of paths of the clock tree circuit, respectively.

17. The data outputting apparatus of claim 14, wherein the clock tree circuit includes a first inverter and a second inverter that are connected in series between each of the plurality of paths.

18. The data outputting apparatus of claim 14, wherein the output timing controller the output timing controller includes at least one variable resistor that is connected in parallel to at least one of the plurality of paths of the clock tree circuit and the variable resistor having a resistance value dependent upon the data output mode signal.

* * * * *